United States Patent
Leam et al.

(10) Patent No.: US 7,410,869 B2
(45) Date of Patent: Aug. 12, 2008

(54) METHOD OF MANUFACTURING A SEMICONDUCTOR DEVICE

(75) Inventors: Hun-Hyeoung Leam, Yongin-si (KR); Hyeon-Deok Lee, Seoul (KR); Young-Sub You, Pyeongtaek-si (KR); Won-Jun Jang, Seoul (KR); Woong Lee, Seoul (KR); Jung-Hyun Park, Seoul (KR); Sang-Kyoung Lee, Incheon (KR); Jung-Geun Jee, Seongnam-si (KR); Sang-Hoon Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 5 days.

(21) Appl. No.: 11/480,380

(22) Filed: Jul. 5, 2006

(65) Prior Publication Data
US 2007/0026651 A1 Feb. 1, 2007

(30) Foreign Application Priority Data
Jul. 5, 2005 (KR) ............. 10-2005-0060035

(51) Int. Cl.
*H01L 21/336* (2006.01)
(52) U.S. Cl. .................. 438/257; 438/787; 438/259; 438/265; 257/E21.179; 257/E27.103; 257/E21.68; 257/E21.682
(58) Field of Classification Search ............ 438/201, 438/211, 257–267, 593, 594; 257/314–326, 257/787; 365/185.01
See application file for complete search history.

(56) References Cited

U.S. PATENT DOCUMENTS

| 5,888,876 A * | 3/1999 | Shiozawa et al. ......... 438/386 |
| 6,100,132 A * | 8/2000 | Sato et al. ............... 438/243 |
| 6,465,293 B2 * | 10/2002 | Park et al. ............... 438/214 |
| 6,495,294 B1 * | 12/2002 | Yamauchi et al. ......... 438/597 |
| 7,223,657 B2 * | 5/2007 | Jang et al. ............... 438/259 |
| 7,273,783 B2 * | 9/2007 | Kim et al. ............... 438/259 |
| 2002/0119627 A1 * | 8/2002 | Nakamura ............... 438/294 |
| 2003/0119257 A1 * | 6/2003 | Dong et al. ............... 438/257 |
| 2004/0127068 A1 * | 7/2004 | Furuhashi et al. ......... 438/778 |
| 2004/0169238 A1 * | 9/2004 | Lee et al. ............... 257/406 |
| 2006/0068547 A1 * | 3/2006 | Lee et al. ............... 438/257 |
| 2006/0105525 A1 * | 5/2006 | Kim et al. ............... 438/257 |

FOREIGN PATENT DOCUMENTS

| JP | 2001-168306 | 6/2001 |
| KR | 10-0370133 | 1/2003 |
| KR | 10-2004-0004896 | 1/2004 |

* cited by examiner

*Primary Examiner*—Bradley W. Baumeister
*Assistant Examiner*—Eric Ward
(74) *Attorney, Agent, or Firm*—Harness, Dickey & Pierce, P.L.C.

(57) ABSTRACT

In a method of manufacturing a semiconductor device such as a flash memory device, an insulating pattern having an opening is formed to partially expose a surface of a substrate. A first silicon layer is formed on the exposed surface portion of the substrate and the insulating pattern. The first silicon layer has an opened seam overlying the previously exposed portion of the substrate. A heat treatment on the substrate is performed at a temperature sufficient to induce silicon migration so as to cause the opened seam to be closed via the silicon migration. A second silicon layer is then formed on the first silicon layer. Thus, surface profile of a floating gate electrode obtained from the first and second silicon layers may be improved.

14 Claims, 6 Drawing Sheets

METHOD OF MANUFACTURING A SEMICONDUCTOR DEVICE

CROSS REFERENCE TO RELATED APPLICATION

This application claims the benefit under 35 USC § 119 of Korean Patent Application No. 2005-60035 filed on Jul. 5, 2005 the disclosure of which is hereby incorporated herein by reference in its entirety as if set forth fully herein.

BACKGROUND

1. Field of the Invention

The present invention relates to a method of manufacturing a semiconductor device.

2. Description of the Related Art

A semiconductor memory device, in general, is classified as either volatile or non-volatile. Volatile semiconductor memory devices, such as dynamic random access memory (DRAM) devices and/or static random access memory (SRAM) devices, have a relatively high response speed. However, the volatile semiconductor memory devices lose data stored therein when power is shut off. Although non-volatile semiconductor memory devices, such as electrically erasable programmable read only memory (EEPROM) devices and/or flash memory devices, have a relatively slow response speed, non-volatile semiconductor memory devices can maintain data stored therein when power is shut off. In EEPROM devices, data is electrically stored (i.e., programmed) or erased through a Fowler-Nordheim (F-N) tunneling mechanism and/or a channel hot electron injection mechanism.

For example, U.S. Pat. No. 6,465,293 discloses a method of manufacturing a flash memory cell. In accordance with the disclosure in U.S. Pat. No. 6,465,293, a method of manufacturing a flash memory cell includes the steps of forming an oxide layer on a semiconductor substrate in which a device isolation layer is formed, patterning the oxide layer to expose the semiconductor substrate at a portion in which a floating gate will be formed to thereby form an oxide layer pattern, sequentially forming a tunnel insulating layer and a first polysilicon layer on the entire structure, planarizing the first polysilicon layer until the oxide layer pattern is exposed to thereby form a floating gate, etching the tunnel insulating layer and the oxide layer pattern in the exposed portion to a given thickness, forming a dielectric layer on the entire structure, sequentially forming a second polysilicon layer, a tungsten suicide layer and a hard mask, patterning the second polysilicon layer, the tungsten silicide layer and the hard mask to form a control gate, and injecting impurity ions into the semiconductor substrate at the both sides of the floating gate to form a junction region.

The floating gate is self-aligned by the oxide layer pattern partially exposing the semiconductor substrate.

As a packing density of the semiconductor device has become more highly integrated, an aspect ratio of an opening defined by the oxide layer pattern (by which a portion of the semiconductor substrate is exposed) has been increased, thereby generating void(s) in the first polysilicon layer filling up the opening.

The void(s) generated in the first polysilicon layer is opened during the planarization process of the first polysilicon layer, and thus an opened seam is formed at a surface of the floating gate. The opened seam deteriorates a breakdown voltage characteristic of the dielectric film formed on the floating gate and a coupling ratio of the flash memory device. Further, leakage current characteristic through the dielectric film is deteriorated.

In the case of partially removing the first polysilicon layer to remove the void(s) in the first polysilicon layer and then forming an additional polysilicon layer on the first polysilicon layer, the tunnel insulating layer between the first polysilicon layer and the semiconductor substrate is damaged by the etchant used during the etching process for removing the void(s). As a result, breakdown voltage characteristic of the tunnel insulating layer is deteriorated.

SUMMARY OF THE INVENTION

At least one if not more embodiments of the present invention provide a method of manufacturing a semiconductor device that can at least substantially reduce if not prevent a seam from occurring at a surface of a silicon layer filling up an opening defined by an insulating pattern.

An example embodiment of the present invention provides a method of manufacturing an inchoate semiconductor device, the method comprising: forming an insulating pattern having an opening partially exposing a surface of a substrate; forming a first silicon layer, on the insulating pattern and the exposed surface portion of the substrate, having an opened seam overlying the previously exposed portion of the substrate; heat treating the first silicon layer at a temperature sufficient to induce silicon migration so as to cause the opened seam to be closed via the silicon migration; and forming a second silicon layer on the first silicon layer after having closed the opened seam.

In accordance with at least one if not more embodiments of the present invention, the opened seam intentionally formed during the formation of the first silicon layer may be closed by performing the heat treatment. Thus, a seam may be prevented from being formed at an upper surface of the floating gate pattern. In addition, a breakdown voltage characteristic and a coupling ratio of a subsequently formed dielectric layer on the floating gate pattern may be improved.

BRIEF DESCRIPTION OF THE DRAWINGS

Example embodiments of the present invention will become readily apparent from the following detailed description when considered in conjunction with the accompanying drawings wherein.

DESCRIPTION OF THE EMBODIMENTS

Figure 1:
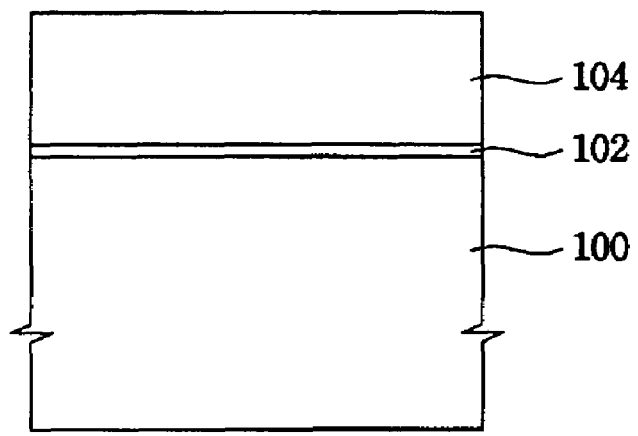
FIGS. 1 to 11 are cross-sectional views illustrating some stages (most of which are intermediate) of a method (in accordance with an example embodiment of the present invention) of manufacturing an inchoate semiconductor device.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" or "against" another element, it can be directly on or against the other element or intervening elements may be present. In contrast, if an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are used only to distinguish one element from another. For example, a first thin film could be termed a second thin film, and, similarly, a second thin film could be termed a first thin film without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one elements relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be explained in detail with reference to the accompanying drawings.

FIGS. 1 to 11 are cross-sectional views illustrating some stages (most of which are intermediate) of a method (in accordance with an example embodiment of the present invention) of manufacturing an inchoate semiconductor device.

Figure 2:
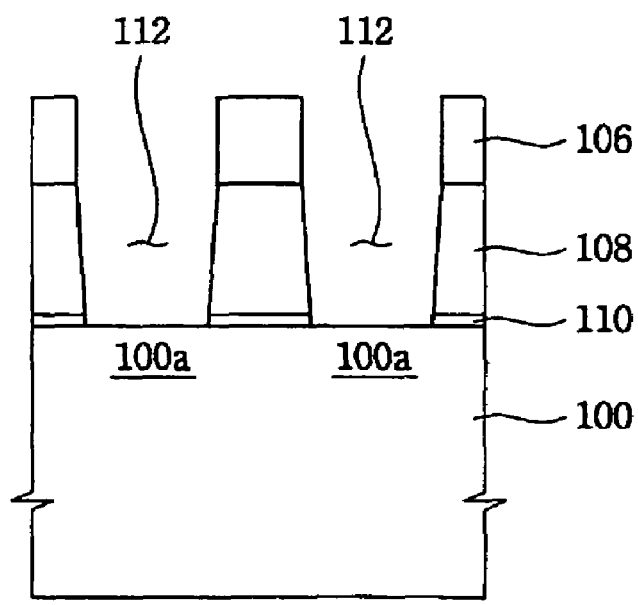

FIG. 1 is a cross-sectional view illustrating a pad oxide layer and a mask layer formed on a semiconductor substrate, and FIG. 2 is a cross-sectional view illustrating a mask pattern formed from the mask layer as shown in FIG. 1.

Referring to FIG. 1, a pad oxide layer 102 is formed on a semiconductor substrate 100 such as a silicon wafer, and a mask layer 104 is then formed on the pad oxide layer 102.

The pad oxide layer 102 may be formed to a thickness, e.g., of about 70 to about 100 Å, e.g., by a thermal oxidation process or a chemical vapor deposition (CVD) process. Further, the pad oxide layer 102 may be formed at a temperature of, e.g., about 750 to about 900° C. for a surface treatment of the semiconductor substrate 100.

The mask layer may include, e.g., silicon nitride and be formed to a thickness, e.g., of about 1500 Å by, e.g., a low pressure chemical vapor deposition (LPCVD) process or a plasma enhanced chemical vapor deposition (PECVD) process using, e.g., SiH2Cl2, SiH4, NH3, and the like.

Referring to FIG. 2, a photoresist pattern 106 partially exposing a surface of the mask layer 104 is formed on the mask layer 104 by a photo process. The mask layer 104 and the pad oxide layer 102 are sequentially etched away by an etching process using the photoresist pattern 106 as an etching mask, thereby forming a mask pattern 108 and a pad oxide pattern 110 on the semiconductor substrate 100. Here, the mask pattern 108 and the pad oxide pattern 110 define first openings 112 exposing would-be isolation regions 100a of the semiconductor substrate 100.

For example, the mask layer 104 and the pad oxide layer 102 may be etched away, e.g., by a dry etching process using, e.g., a plasma or a reactive ion etching process. The photoresist pattern 106 is removed, e.g., by ashing and stripping processes after forming the mask pattern 108 and the pad oxide pattern 110.

Figure 3:
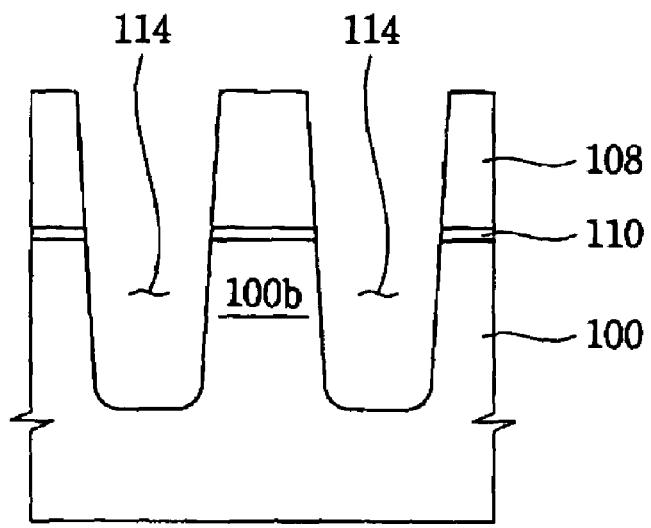
Figure 4:
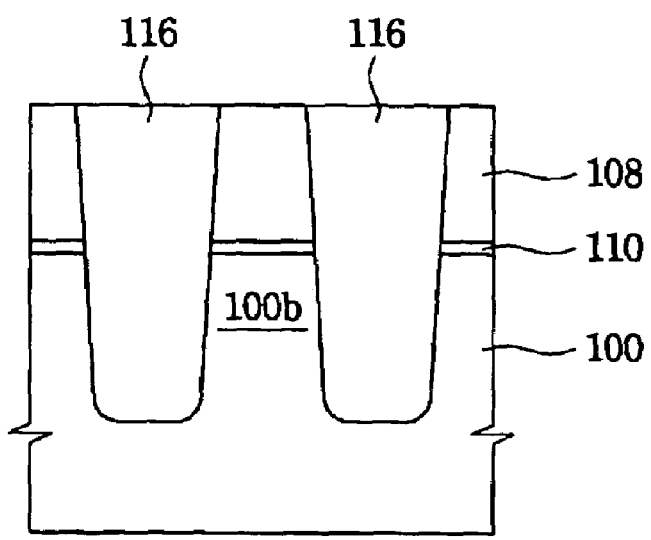

FIG. 3 is a cross-sectional view illustrating a trench formed in the semiconductor substrate using the mask pattern as shown in FIG. 2, and FIG. 4 is a cross-sectional view illustrating a field insulating pattern formed in the trench as shown in FIG. 3.

Referring to FIG. 3, an etching process using the mask pattern 108 as an etching mask is performed to etch away the would-be isolation regions 100a of the semiconductor substrate 100, thereby forming a trench 114 extending in a first direction across the semiconductor substrate 100. The trench 114 may be formed to a depth, e.g., of about 1000 to about 5000 Å from the surface of the semiconductor substrate 100.

Here, side walls of the trench 114 are formed to have an angle of inclination with respect to the surface of the semiconductor substrate 100 during the etching process.

Alternatively, a thermal oxidation process on sidewalls of the trench 114 may be additionally performed so as to cure silicon damage caused by impinging high energy ions during the etching process for forming the trench 114 and prevent generation of leakage current through the sidewalls of the trench 114. Trench oxide layers (not shown) may be formed to a thickness, e.g., of about 50 to about 250 Å on the inner surfaces of the sidewalls of the trench 114 during the thermal oxidation process.

Further, liner nitride layers (not shown) may be formed to a thickness, e.g., of about 50 to about 100 Å on the trench oxide layers. Such liner nitride layers at least substantially reduce if not prevent diffusion of impurities (such as carbon and hydrogen) from a subsequently formed trench-filling layer, e.g., a field insulating layer, into an active region 100*b* defined by the trench 114.

Then, a field insulating layer is formed on the semiconductor substrate 100 in which the trench 114 is formed so as to sufficiently fill up the trench 114 and first opening 112. The field insulating layer may include silicon oxide such as undoped silicate glass (USG), tetra ethyl ortho silicate (TEOS), high density plasma (HDP) CVD oxide, and the like. For example, the field insulating layer may be formed, e.g., by a HDP CVD process using SiH4, O2 and Ar as plasma source gases.

Referring to FIG. 4, a planarization process such as a chemical mechanical polishing process is performed to remove an upper portion of the field insulating layer until the mask pattern 108 is exposed, thereby forming a field insulating pattern 116 in the trench 114 and the first opening 112. The field Insulating layer 116 serves as an isolation layer and defines the active region 100*b* of the semiconductor substrate 100.

Figure 5:
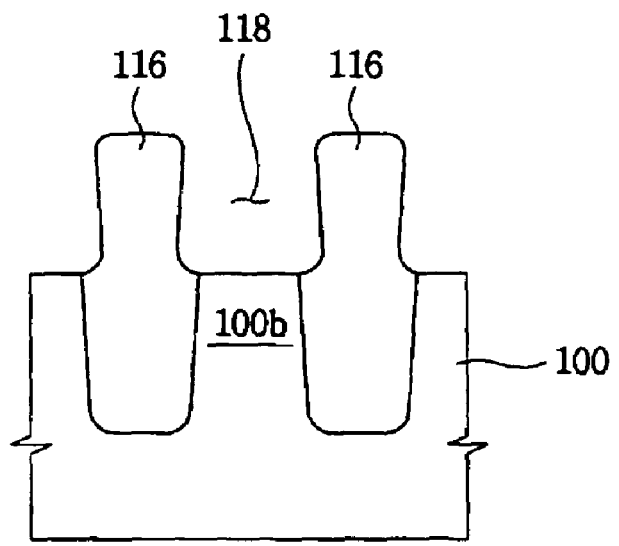
Figure 6:
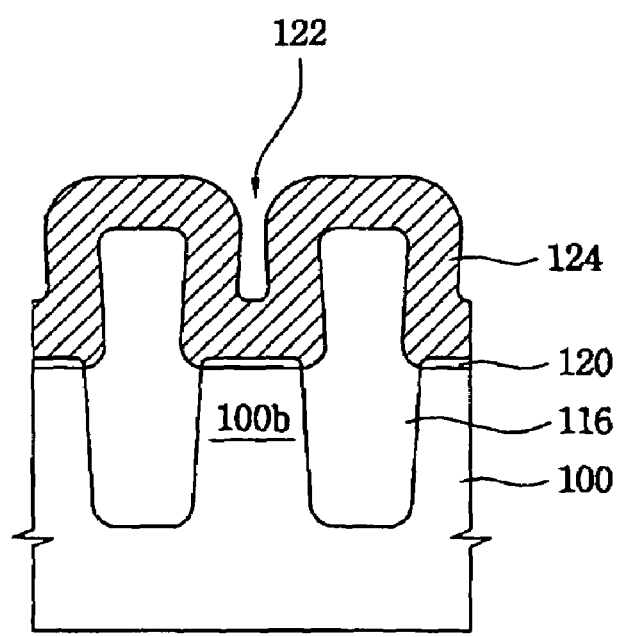

FIG. 5 is a cross-sectional view illustrating a second opening exposing an active region as shown in FIG. 4, and FIG. 6 is a cross-sectional view illustrating a tunnel insulating layer and a first silicon layer formed on the active region as shown in FIG. 5.

Referring to FIG. 5, the mask pattern 108 and the pad oxide layer pattern 110 are removed to form a second opening 118 exposing the active region 100*b* of the semiconductor substrate 100. Particularly, the mask pattern 108 may be removed, e.g., by an etching solution including, e.g., phosphoric acid, and the pad oxide layer pattern 110 may be removed, e.g., by a diluted hydrofluoric acid solution. As shown in figures, the field insulating pattern 116 may be partially removed while the mask pattern 108 and the pad oxide layer pattern 110 are removed.

Referring to FIG. 6, a tunnel insulating layer 120 is formed on the exposed active region 100*b*. The tunnel insulating layer 120 may include silicon oxide formed, e.g., by a thermal oxidation process. Alternatively, the tunnel insulating layer 120 may include, e.g., fluorine doped silicon oxide, carbon doped silicon oxide, a low-k material, and the like.

A first silicon layer 124 having an opened seam 122 is formed on the tunnel insulating layer 120 and the field insulating pattern 116. The first silicon layer 124 may include, e.g., impurity doped amorphous silicon. For example, the first silicon layer 124 may be formed at a temperature, e.g., of about 450 to about 550° C. using, e.g., SiH4 and PH3 gases. Here, a ratio of a thickness of the first silicon layer 124 to a width of the second opening 118 may be set in a range, e.g., of about 0.3 to about 0.4 so as to sufficiently open an upper portion of the seam 122.

Figure 7:
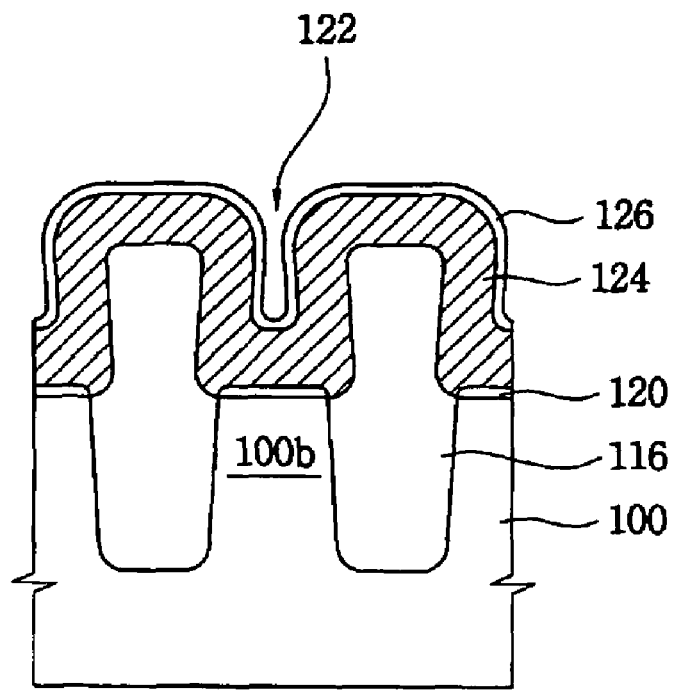
Figure 8:
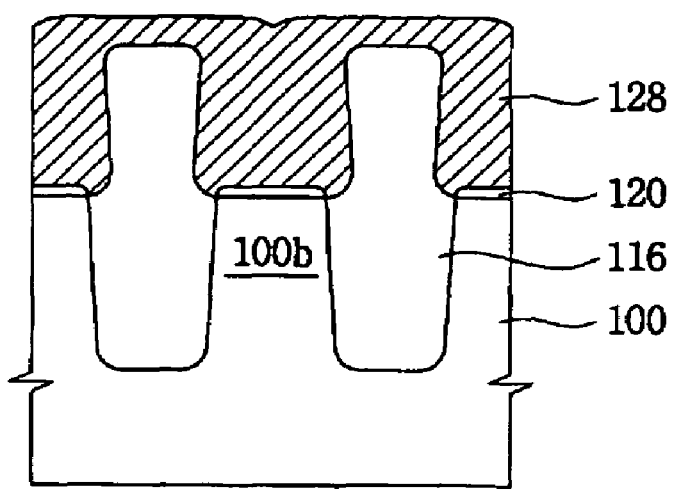

FIG. 7 is a cross-sectional view illustrating a silicon oxide layer formed on the first silicon layer as shown in FIG. 6, and FIG. 8 is a cross-sectional view illustrating the removal of the silicon oxide layer and opened seam as shown in FIG. 7.

Referring to FIG. 7, a silicon oxide layer 126 is formed to a thickness, e.g., of about 10 Å to about 50 Å on the first silicon layer 124. The silicon oxide layer 126 may be formed, e.g., by exposing the first silicon layer 124 to an atmosphere including oxygen. For example, the silicon oxide layer 126 may be formed, e.g., by keeping the semiconductor substrate 100 in a clean room for a predetermined time.

Referring to FIG. 8, the silicon oxide layer 126 and the opened seam 122 are removed, e.g., by heat treating the semiconductor substrate 100. The heat treatment of the semiconductor substrate 100 may be performed at a temperature, e.g., at which silicon migration occurs and under an atmosphere including, e.g., hydrogen. For example, the heat treatment may be performed at a temperature of about 850° C. to about 1000° C.

Without being bound by theory, while the heat treatment is performed, hydroxyl radical (OH) and/or water vapor is produced by a reduction reaction between hydrogen and the silicon oxide layer 126. Consequently, oxygen in the silicon oxide layer 126 is removed and the opened seam 122 is closed by the silicon migration that occurs together with the removal of the oxygen. In other words, the silicon migration is promoted by the reduction reaction between hydrogen and the silicon oxide layer 126, with the result that the opened seam 122 is sufficiently filled up by the silicon migration.

Further, the first silicon layer 124 is crystallized during the heat treatment, and the impurities in the first silicon layer 124 are electrically activated. As a result, a polysilicon layer 128 sufficiently filling up the second opening 118 is formed on the tunnel insulating layer 120 and the field Insulating pattern 116.

Figure 9:
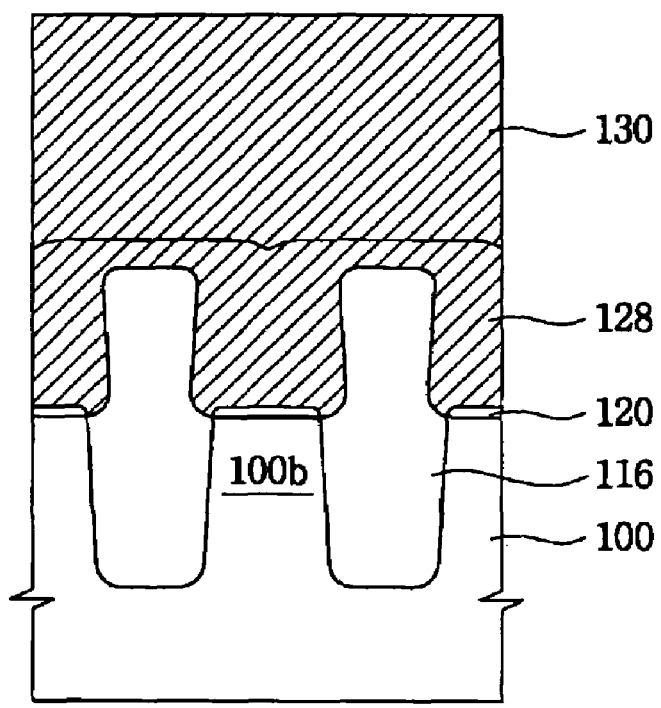
Figure 10:
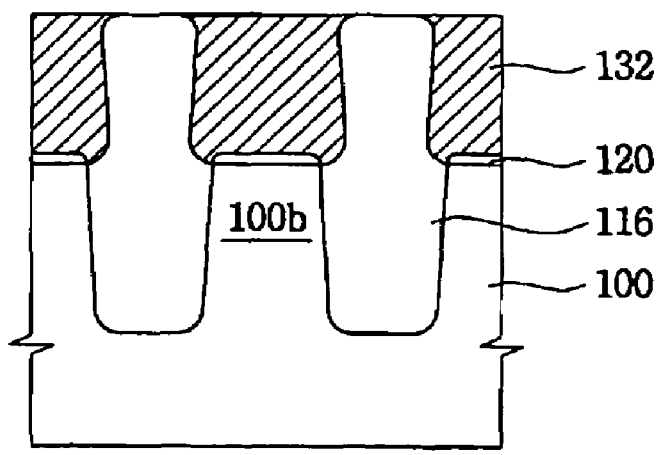

FIG. 9 is a cross-sectional view illustrating a second silicon layer formed on a crystallized first silicon layer as shown in FIG. 8, and FIG. 10 is a cross-sectional view illustrating a floating gate pattern formed in the second opening as shown in FIG. 9.

Referring to FIG. 9, a second silicon layer 130 is formed on the polysilicon layer 128 (again, also referred to as the crystallized first silicon layer). Particularly, the second silicon layer 130 may include, e.g., impurity doped polysilicon and be formed to a temperature, e.g., of about 580 to about 620° C. using, e.g., SiH4 and PH3 gases.

A planarization process such as a CMP process and an etching back process is performed until the field insulating pattern 116 is exposed so that a remainder of polysilicon layer 128 thereby forms a floating gate pattern 132 in the location that had been the second opening 118.

As described above, the opened seam 122 artificially formed in the second opening 118 may be sufficiently filled up by the heat treatment under the hydrogen-containing atmosphere, thereby obtaining the floating gate pattern 132 without the seam or void(s)

Figure 11:
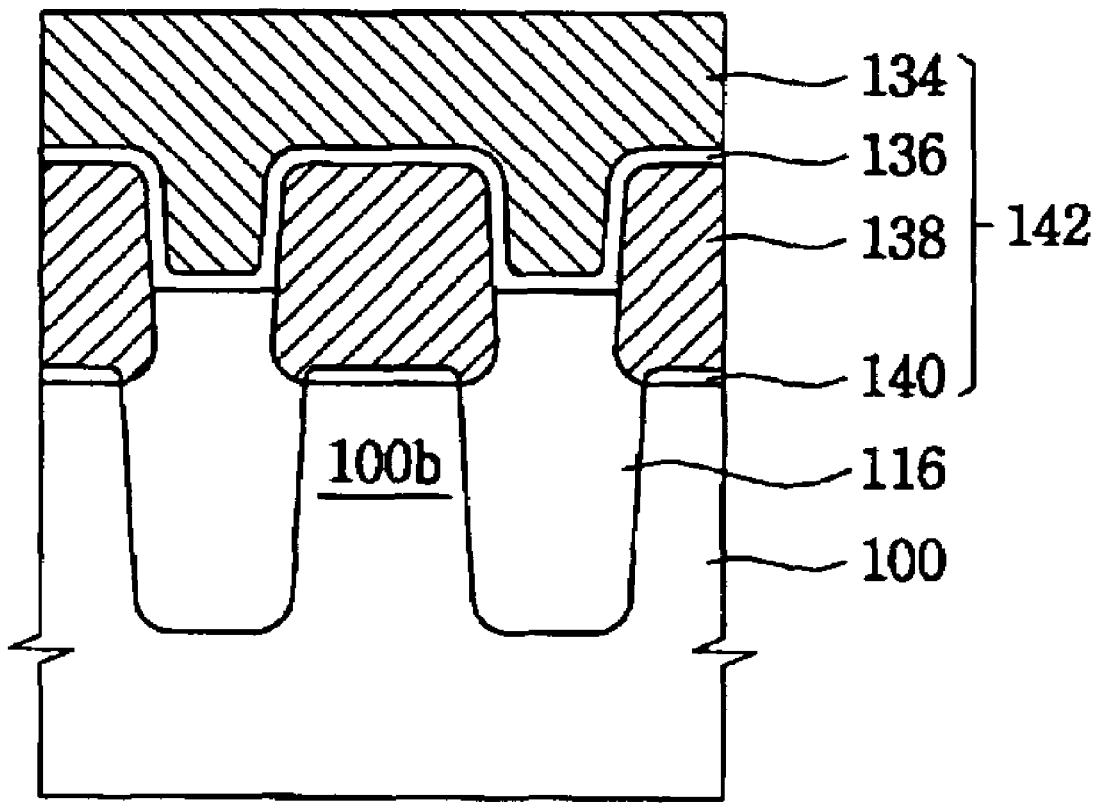

FIG. 11 is a cross-sectional view illustrating a semiconductor device including a floating gate electrode obtained from the floating gate pattern as shown in FIG. 10, as made by a method according to an embodiment of the present invention.

Referring to FIG. 11, an upper portion of the field insulating pattern 116 is removed to expose upper sidewall portions of the floating gate pattern 132. The field insulating pattern 116 may be partially removed, e.g., by an isotropic or anisotropic etching process. The etching process may be desirably performed to prevent damage of the tunnel insulating layer 120 due to etching solution or etching gas so that the tunnel insulating layer 120 is not exposed. Further, edge portions of the floating gate pattern 132 may be rounded while removing the upper portion of the field insulating pattern 116.

Then, a dielectric layer (not shown) is formed on the floating gate pattern 132 and the field insulating pattern 116. The dielectric layer may include, e.g. composite material such as oxide/nitrideloxide (ONO), high-k material, and the like. A composite dielectric layer including the composite material may be formed, e.g., by a LPCVD process, and a high-k material layer may include, e.g., Al2O3, Y2O3, HfO2, ZrO2, Nb2O5, BaTiO3, SrTiO3, and the like, and be formed by an atomic layer deposition (ALD) or metal organic chemical vapor deposition (MOCVD) process.

A control gate conductive layer (not shown) is formed on the dielectric layer. The control gate conductive layer may include, e.g., impurity doped polysilicon, metal silicide, and the like. The metal silicide may include, e.g., tungsten silicide (WSix), titanium silicide (TiSix), cobalt silicide (CoSix), tantalum silicide (TaSix), and the like.

The control gate conductive layer (again, not shown) is patterned so as to form a control gate electrode 134 extending in a second direction different from the first direction. Further, the dielectric layer (again, not shown), floating gate pattern 132 and the tunnel insulating layer 120 are sequentially patterned so as to constitute a gate structure 142 of the semiconductor device such as a flash memory device including the control gate electrode 134, a dielectric layer pattern 136, a floating gate electrode 138 and a tunnel insulating layer pattern 140.

Though not shown in figures, source/drain regions are formed at surface portions of the active region 100b of the semiconductor substrate 100 adjacent to the gate structure 142 by, e.g., an impurity doping process.

In accordance with at least one of the example embodiments of the present invention, the artificially opened seam may be sufficiently removed by the heat treatment under the hydrogen-containing atmosphere, and thus a surface profile of the floating gate electrode may be improved. Further, leakage current and breakdown voltage characteristics of the dielectric layer pattern may be improved.

Although the example embodiments of the present invention have been described, it is understood that the present invention should not be limited to these example embodiments but various changes and modifications can be made by one skilled in the art within the spirit and scope of the present invention as hereinafter claimed.

What is claimed is:

1. A method of manufacturing an inchoate semiconductor device, the method comprising:
    forming an insulating pattern having an opening partially exposing a surface of a substrate;
    forming a first silicon layer, on the insulating pattern and the exposed surface portion of the substrate, having an opened seam overlying the previously exposed portion of the substrate;
    forming a silicon oxide layer on the first silicon layer;
    heat treating the first silicon layer at a temperature sufficient to induce silicon migration so as to cause the opened seam to be closed, wherein the first silicon layer is heat treated under an atmosphere including hydrogen, and the silicon migration is promoted by a reduction reaction between hydrogen and the silicon oxide layer; and
    forming a second silicon layer on the first silicon layer after having closed the opened seam.

2. The method of claim 1, wherein the silicon oxide layer is formed by exposing the first silicon layer to an atmosphere including oxygen.

3. The method of claim 1, wherein the heat treatment is performed at a temperature of about 850 to about 1000°C.

4. The method of claim 1, wherein the first silicon layer includes impurity doped amorphous silicon and is crystallized by the heat treatment.

5. The method of claim 1, wherein the second silicon layer includes impurity doped polysilicon.

6. The method of claim 1, further comprising
    forming a tunnel insulating layer on the exposed surface portion of the substrate after forming the insulating pattern.

7. The method of claim 1, further comprising
    performing a planarization process until the insulating pattern is exposed such that a remainder of the first silicon layer represents a floating gate pattern in the opening.

8. A method of manufacturing a semiconductor device, the method comprising:
    forming a mask pattern having a first opening partially exposing a surface of a substrate;
    forming a trench in the substrate using the mask pattern;
    forming an insulating pattern in the first opening and the trench;
    removing the mask pattern to form a second opening exposing an inchoate active region of the substrate;
    forming a first silicon layer, on the exposed active region and the insulating pattern, having an opened seam overlying the inchoate active region;
    forming a silicon oxide layer on the first silicon layer;
    heat treating the first silicon layer at a temperature sufficient to induce silicon migration so as to cause the opened seam to be closed via the silicon migration, wherein the first silicon layer is heat-treated under an atmosphere including hydrogen, and the silicon migration is promoted by a reduction reaction between hydrogen and the silicon oxide layer;
    forming a second silicon layer on the first silicon layer after having closed the opened seam; and
    performing a planarization process until the insulating pattern is exposed such that a remainder of the first silicon layer represents a floating gate pattern in the second opening.

9. The method of claim 8, wherein the silicon oxide layer is formed by exposing the first silicon layer to an atmosphere including oxygen.

10. The method of claim 8, wherein the heat treatment is performed at a temperature of about 850 to about 1000°C.

11. The method of claim 8, wherein the first silicon layer includes impurity doped amorphous silicon and is crystallized by the heat treatment.

12. The method of claim 8, wherein the second silicon layer includes impurity doped polysilicon.

13. The method of claim 8, further comprising
    forming a tunnel insulating layer on the exposed active region of the substrate after removing the mask pattern.

14. The method of claim 13, further comprising:
    sequentially forming a dielectric layer and a control gate conductive layer on the floating gate pattern and insulating pattern; and
    sequentially patterning the control gate conductive layer, the dielectric layer, the floating gate pattern and the tunnel insulating layer so as to form a gate structure including a tunnel insulating layer pattern, a floating gate electrode, a dielectric layer pattern and a control gate electrode.

* * * * *